(12) United States Patent
Klippert, II et al.

(10) Patent No.: US 6,270,622 B1
(45) Date of Patent: Aug. 7, 2001

(54) METHOD AND APPARATUS FOR IMPROVING ACCURACY OF PLASMA ETCHING PROCESS

(75) Inventors: Walter E Klippert, II, Moraga, CA (US); Vikorn Martin Kadavanich, Bayerisch Gmain (DE)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/546,428

(22) Filed: Apr. 10, 2000

Related U.S. Application Data

(62) Division of application No. 09/163,303, filed on Sep. 30, 1998.

(51) Int. Cl.$^7$ .................................................. H05H 1/00
(52) U.S. Cl. ........................................ 156/626.1; 156/345
(58) Field of Search ............................ 156/345, 643.1, 156/657.1, 626.1, 627.1; 118/712, 715

(56) References Cited

U.S. PATENT DOCUMENTS

| | | |
|---|---|---|
| 4,328,068 | 5/1982 | Curtis . |
| 4,367,044 | 1/1983 | Booth, Jr. et al. . |
| 4,376,672 | 3/1983 | Wang et al. . |
| 4,615,761 | 10/1986 | Tada et al. . |
| 4,675,072 * | 6/1987 | Bennett et al. .............. 156/345 |
| 4,927,785 | 5/1990 | Theeten et al. . |
| 5,013,398 | 5/1991 | Long et al. . |
| 5,013,400 | 5/1991 | Kurasaki et al. . |
| 5,021,121 | 6/1991 | Groeschel et al. . |
| 5,022,958 | 6/1991 | Favreau et al. . |
| 5,045,149 | 9/1991 | Nulty . |
| 5,131,752 | 7/1992 | Yu et al. . |
| 5,269,879 | 12/1993 | Rhoades et al. . |
| 5,362,356 | 11/1994 | Schoenborn . |
| 5,413,966 | 5/1995 | Schoenborn . |
| 5,450,205 | 9/1995 | Sawin et al. . |
| 5,529,657 | 6/1996 | Ishii . |
| 5,595,627 | 1/1997 | Inazawa et al. . |
| 5,611,888 | 3/1997 | Bosch et al. . |
| 5,747,380 | 5/1998 | Yu et al. . |
| 5,780,338 | 7/1998 | Jeng et al. . |
| 5,807,761 | 9/1998 | Coronel et al. . |

FOREIGN PATENT DOCUMENTS

| | | |
|---|---|---|
| 511448 | 11/1992 | (EP) . |
| 679948 | 11/1995 | (EP) . |
| 889359 | 1/1999 | (EP) . |
| 62-299032 | 12/1987 | (JP) . |

* cited by examiner

Primary Examiner—Gregory Mills
Assistant Examiner—P. Hassonzadeh
(74) Attorney, Agent, or Firm—Burns, Doane, Swecker & Mathis, LLP

(57) ABSTRACT

The invention provides a process and apparatus for improving the accuracy of plasma etching processes such as trench and recess etch processes. In such processes, a trench or recess is etched into a layer of material which does not have a stop layer at the desired depth of the etched openings. Instead, the etching process is carried out for a set time period calculated to achieve a desired etch depth on the basis of measured or estimated etching rates. For example, the duration of etching to achieve a target depth may be based on statistical analysis or real-time measurements of etch depths by interferometry. However, use of estimated etching rates or interferometry to control when etching should be terminated to achieve a desired etch depth can result in defective structures due to etched openings which are too deep or too shallow. According to the invention, a technique is provided for controlling the etching process in a manner which achieves more accurate etch depths in a more reproducible way by conducting a masking layer thickness measurement as part of the etching process.

13 Claims, 1 Drawing Sheet

METHOD AND APPARATUS FOR IMPROVING ACCURACY OF PLASMA ETCHING PROCESS

This application is a divisional of application Ser. No. 09/163,303, filed Sep. 30, 1998.

FIELD OF THE INVENTION

The present invention relates to a plasma etching process and apparatus for improving the accuracy thereof.

BACKGROUND OF THE INVENTION

A common requirement in integrated circuit fabrication is the etching of openings such as trenches, recesses, contacts and vias in a stack of materials which may include conductive, semiconductive and dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The conductive or semiconductive materials include polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627; 5,611,888; and 5,780,338. The plasma etching can be carried out in medium density reactors such as the parallel plate plasma reactor chambers described in the '398 patent or the triode type reactors described in the '400 patent or in high density reactors such as the inductively coupled plasma reactors described in the '657 patent.

Integrated circuit processing requires tight control over decreasing geometries on increasing wafer size. As a result, monitoring costs in such manufacturing processes have been increasing in spite of the use of in-line monitoring equipment and techniques. As device geometries become smaller, considerable effort has been devoted to improving etching processes for purposes of achieving defect-free integrated circuit structures. See, for example, U.S. Pat. Nos. 5,131,752; 5,362,356; and 5,450,205.

One problem in achieving precise depths during plasma etching processes is due to variation in mask thickness. Such mask thickness variation can result from chemical mechanical polishing (CMP) carried out before the etching process. Although such polishing processes may provide a target thickness for the mask, there will be a certain degree of variation in the masking layer thickness among wafers being processed. In etching processes wherein the target etch depth is controlled by determining etch depth in situ with an interferometer, variation in mask thickness wafer to wafer can contribute to over or under etching of openings such as vias, contacts, trenches, etc. in the layer beneath the masking layer.

It is known to monitor etching process endpoints in plasma chambers by analyzing emissions of substances in the plasma chamber. Typically, as disclosed in, e.g., U.S. Pat. No. 4,615,761, this involves monitoring the quantity of radiation corresponding to a selected one of the plasma reaction products to ascertain when the reaction is finished. U.S. Pat. No. 5,045,149 discloses a method and apparatus for detecting the endpoint of a process of etching a first material over a second material. The optical emission intensity of the plasma etch process is simultaneously monitored by a positive filter and a negative filter generating first and second signals, respectively, the first and second signals being combined to yield a combined signal. The combined signal is monitored for a change indicative of the first material having been etched away and exposing the second material.

U.S. Pat. No. 5,450,205 discloses monitoring etching of a wafer or deposition of a thin film on a wafer by means of a charge coupled device (CCD) camera which views the wafer during plasma processing. Plasma emission or laser illumination reflected from the wafer exhibit temporal modulations caused by interferometry during etching or deposition of the wafer and are used to monitor etching or deposition process endpoints.

U.S. Pat. No. 5,413,966 discloses a trench etch process wherein a trench mask is formed of an upper layer of doped or undoped polysilicon and a lower layer of silicon dioxide or silicon nitride. The two layers are patterned in a first etch step to form a trench mask for subsequent etching of trenches in the underlying silicon substrate. The upper layer is deposited in a thickness corresponding to the depth of the trenches to be etched. The trench etch endpoint is provided by clearing the polysilicon and exposure of the lower layer of the mask. In such a process, variation of the upper layer thickness (e.g., due to variations in deposition process or thickness reducing process such as chemical mechanical polishing) from one wafer to the next in a batch of wafers being processed under identical etching conditions could lead to trenches which are too deep or too shallow for their intended use. Further, if the substrate does not include a stop layer which would allow monitoring of a gaseous species such as by mass spectrometry, in situ measurement and real time control of the etching process to achieve a desired etch depth becomes problematic.

U.S. Pat. No. 5,807,761 discloses a method for real-time and in-situ monitoring for a trench formation process. According to this method, interferometry is used to monitor the etch depth during the etching process. However, use of such a measurement to control the endpoint of etching can lead to inaccurate results since interferometry only provides the etch depth relative to the top of the structure being etched. In the case of etching openings in a masking layer, if the masking layer is etched along with the openings, the measurement of etch depth provided by interferometry, while providing potential for improvement over a timed etch, may not be sufficient to prevent out-of-specification etch depths since compensation for variation in the masking layer thickness prior to etching is not taken into account in the etch depth measurement.

As commercial manufacturing techniques adopt smaller device geometries, it becomes evermore critical to achieve precise etch depths from one wafer to the next during mass production. The prior techniques wherein timed etches were used to achieve a target etch depth are no longer suitable for mass production since even small variations in the actual etch depths relative to the underside of the masking layer can lead to inoperative devices if the openings are too deep or too shallow.

SUMMARY OF THE INVENTION

The invention provides a method of etching openings in a semiconductor substrate in a plasma chamber, comprising steps of supporting a semiconductor substrate on a substrate support in a plasma chamber, the semiconductor substrate including a masking layer and openings in the masking layer containing a material to be etched; etching the material in the openings of the masking layer by generating an etching plasma in the plasma chamber; measuring a thickness of the masking layer prior to completing etching of the material in the openings in the masking layer; controlling duration of the etching step to achieve a target etch depth relative to an underside of the masking layer; extinguishing the etching plasma when the target etch depth of the openings is obtained; and removing the substrate from the chamber.

According to one aspect of the invention, the measuring step can be carried out by interferometry and/or the thickness measuring step can be carried out when a chemical species in the plasma such as silicon chloride or CO is detected. According to another aspect, a layer of material overlying the masking layer is cleared from the masking layer prior to the thickness measuring step. For instance, a layer of material overlying the masking layer can be removed by chemical mechanical polishing prior to the etching step. The method of the invention is advantageous in etching operations wherein the material in the openings does not include a stop layer at the target etch depth. In a preferred embodiment, the masking layer consists essentially of silicon nitride and the material in the openings consists essentially of polysilicon. However, the masking layer can comprise two or more layers of material or a photoresist.

The invention also provides an apparatus for etching openings in a semiconductor substrate in a plasma chamber, the apparatus comprising: a plasma etching chamber including a gas supply for supplying an etching gas into an interior of the chamber; a substrate support for supporting a semiconductor substrate in the interior of the plasma chamber, the semiconductor substrate including a masking layer and openings in the masking layer containing a material to be etched; an energy source which energizes the etching gas into a plasma which etches the material in the openings of the masking layer during an etching step; a thickness measuring device which measures a thickness of the masking layer and outputs a signal representative of the measured masking layer thickness prior to completing etching of the material in the openings in the masking layer; and a controller which receives the signal outputted from the thickness measuring device and automatically adjusts the etching step to achieve a target etch depth relative to an underside of the masking layer, the controller terminating the etching step when the target etch depth of the openings is obtained.

According to one aspect of the invention, the thickness measuring device is an interferometer and/or the apparatus further comprises a detector which detects exposure of an upper surface of the masking layer during etching of a layer of material overlying the masking layer, the detector outputting a thickness measuring signal to the controller when a chemical species in the plasma is detected. The chemical species can be silicon chloride in the case where the masking layer includes silicon nitride and the material in the openings is polysilicon or CO in the case where the masking layer is a photoresist. According to one embodiment, the thickness measuring device measures the thickness of the masking layer during an etching process which includes clearing a layer of material overlying the masking layer. According to another embodiment, the thickness measuring device measures the thickness of a masking layer which has been planarized by chemical mechanical polishing. According to a further embodiment, the controller terminates the etching step during etching of material in the openings wherein a stop layer is not present at the target etch depth.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION OF THE PREFERRED EMBODIMENTS

Figure 1:
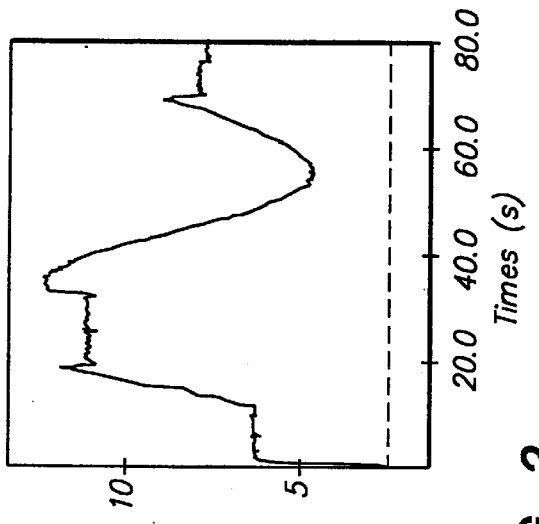
FIG. 1 shows a curve obtained by interferometry for a spectral range of 400 to 500 nm, the curve indicating the presence of a transparent film and being usable for developing a software program which measures a masking layer thickness in accordance with the invention.

The invention provides a process of improving the accuracy of plasma etching processes such as trench and recess etch processes. In such processes, a trench or recess is etched into a layer of material which does not have a stop layer at the desired depth of the etched openings. Instead, the etching process is a timed etch which is carried out for a set time period calculated to achieve a desired etch depth on the basis of measured or estimated etching rates. For example, the duration of etching to achieve a target depth may be based on statistical analysis or real-time measurements of etch depths by interferometry. However, use of estimated etching rates or interferometry to control when etching should be terminated to achieve a desired etch depth can result in defective structures due to etched openings which are too deep or too shallow. According to the invention, a technique is provided for controlling the etching process in a manner which achieves more accurate etch depths in a more reproducible way.

According to the invention, an etching process is monitored in a manner which allows more accurate etch depths to be obtained. The etching process can be carried out in low, medium or high density plasma reactors and any suitable film thickness and etch depth monitoring equipment can be used in accordance with the present invention. Equipment and data processing software for measuring film thicknesses are available from various companies such as Rudolph Technologies, Inc., Prometrix, Leybold, Sofie, SC Technology, etc. In the following examples, the etching process was carried out in a 9400 PTX™ high density plasma etcher available from LAM Research Corporation and measurements of film thicknesses and etch depths were obtained using an Inspector 3000 interferometric film thickness and etch depth monitoring system available from SC Technology, Inc.

The invention provides a real-time etch depth monitoring arrangement which compensates for variation in masking layer thicknesses wafer-to-wafer during processing of a batch of wafers in a single wafer etcher. According to the invention, the thickness of the masking layer is determined by an automated process which measures the masking layer thickness of each wafer prior to etching openings in the masking layer. The masking layer is preferably a hard mask of a material such as a nitride or oxide material. In etching processes wherein the semiconductor substrate is subjected to CMP to remove layers above the masking layer prior to etching, due to variation in the thickness of the masking layer after CMP, use of interferometry to determine etch depth can lead to imprecision since the upper surface of the mask is used as a geometric reference. In order to provide a more precise determination of the etch depth according to the invention, the thickness of the masking layer after CMP is used to correct the etch depth during the interferometric endpoint etch of the recess. This can be accomplished by adding a software routine in the external endpoint system software or on the etcher software itself. The mask thickness measurement can also be used for other in-line measurements where corrections may be useful.

The masking layer thickness measurement can be made by standard interferometric techniques and used as a reference point during the ensuing or remaining etching process. For example, after a wafer enters the plasma chamber and is clamped on a suitable substrate support such as an electrostatic chuck, a thickness measurement of the masking layer is carried out by any suitable technique such as with an interferometric system. The interferometric system can record the interferometric signal pattern from the wafer and the shape of the signal can be determined by the optical coefficients and the thicknesses of the transparent films that are on the wafer. If the uppermost film is not transparent to the wavelength range of the illuminating light, and the wafer surface is flat, no signal pattern will be visible. If the uppermost film is transparent to the wavelength range, the process of the invention can be used to improve the accuracy of the etch depth measurement.

The invention provides a process which can improve the accuracy of plasma etching processes such as trench and recess etch processes. In such processes, a trench or recess is etched into a layer of material which does not have a stop layer at the desired depth of the etched openings. Instead, the etching process is carried out for a set time period calculated to achieve a desired etch depth on the basis of measured or estimated etching rates. For example, the duration of etching to achieve a target depth may be based on statistical analysis or real-time measurements of etch depths by interferometry. However, use of estimated etching rates or interferometry to control when etching should be terminated to achieve a desired etch depth can result in defective structures due to etched openings which are too deep or too shallow. According to the invention, a technique is provided for controlling the etching process in a manner which achieves more accurate etch depths in a more reproducible way. By varying the wavelength of the illuminating light, some sort of sinusoidal pattern will appear in a plot of reflected intensity versus illuminating light wavelength. The shape of this pattern will be a function of the thickness of the film, the transparency or opacity of the films underneath this film, the thicknesses of the underlying films, and the optical coefficients of all the films. If the thicknesses and optical coefficients of the underlying films and the optical coefficient of the upper film are known, it is possible to construct a theoretical signal for a given thickness of the upper film. By varying the input given thickness for the upper film, it is possible to create a pattern that closely matches the actual pattern of reflected intensity versus wavelength. This match will happen at the point when the input thickness for the upper film is equal to the actual thickness of the upper film. According to the invention, the above describe technique for measuring film thicknesses can be used in an automated process which compensates for the endpoint of the etching step for each wafer as it is being processed. As a result, more precise etch depths can be obtained and the production efficiency can be improved by eliminating the need to conduct off-line measurement of mask thicknesses following CMP to estimate the period of the timed etch to accommodate the range of mask thicknesses likely to be encountered during etching of a batch of wafers.

The process according to the invention is useful in determining a more accurate endpoint of an etching process wherein the masking layer is etched at the same time areas not covered by the masking layer are etched. In such processes the etching recipe is designed to etch the masking layer at a slower rate than the areas not covered by the masking layer. During the etching process, the signal seen by the interferometer will change since it will be seeing the light reflected from the upper and lower surfaces of the masking layer, the films under the masking layer and the light reflected from the bottoms of the recesses being etched. If the etch rate of the uppermost film is known compared to the etch rate of the film that is masked by the uppermost film, it is possible to estimate how much of the uppermost film is removed over time by the etching process. The signal created by the uppermost film or mask and the underlying films can be subtracted from the total signal, which is a combination of the film signals and the signal from the bottom of the recesses. In this way, a more accurate determination of the depth of the recesses can be obtained.

In traditional interferometric recess/trench etch depth measurements, the depth of the etched openings is related to the top of the masking layer. Although there is a statistical possibility that an actual mask thickness may equal an expected mask thickness, it is more likely due to fluctuations in the manufacturing process that the masking layer will vary in thickness to some extent. By referencing the etch depth measured by interferometry to the top of the masking layer, in device structures requiring high precision, terminating the etch process as a function of the distance between the bottom of the opening and the top of the masking layer can result in etch depths which do not meet etch depth requirements. This is especially a problem when the masking layer is thinner than expected. A more accurate etch depth determination can be obtained by referencing the measured etch depth to the bottom of the masking layer rather than the top of the masking layer. The bottom of the masking layer serves as a critical reference point even when the masking layer is a hard mask over a pad oxide which serves as a stop layer when the hard mask is removed.

According to the invention, it may be useful to use different wavelengths of light for the masking layer thickness measurement. For example, the longer the wavelength of the light, the more transparent the film appears to be. However, in shallow recess/trench etches (e.g., target depths of 200 to 300 nm) it may be necessary to use shorter wavelengths on the order of 100 to 150 nm to measure the shallow etch depths. Such shorter wavelengths may make the mask appear to be opaque to the measuring light in which case there will not be a signal generated by the bottom of the mask layer which can be analyzed in situ to determine mask thickness if only single wavelength is used. According to the invention, the mask thickness can be measured at a fixed point in time by looking at the pattern generated by a spectrum of wavelengths, i.e., a range of frequencies.

In the case where a layer overlying the masking layer is not completely removed by the bulk etch step, it may be desirable to further improve the accuracy of the masking layer thickness measurement by modifying the etching process to completely remove the residue on the masking layer. For instance, the masking layer thickness measurement could be delayed until after the recess etch is started or the bulk etch could be continued for a short time such as a few seconds beyond the endpoint signal generated by monitoring a chemical species of the plasma. As an example, the recess etch could be started for a time sufficient to clear enough of the residue to improve the accuracy of the thickness measurement, the thickness measurement could be carried out during a stabilization step during which the RF energy is turned off, and the recess etch could be completed after the measurement is completed. A process routine for clearing residue from a masking layer could include the following steps: gas stability for breakthrough of native oxide (no plasma), breakthrough to remove native oxide, gas stability for bulk etch (no plasma), bulk etch with endpoint monitored by decline in intensity of chemical species, gas stability for bulk overetch, bulk overetch timed to clear residue left in bulk etch and just begin the recess etch, gas stability for recess etch (no plasma), measure thickness of masking layer, recess etch with endpoint based on interferometry comparing measured etch depth to previously measured mask thickness adjusted for reduction in thickness during the recess etch.

In summary, various advantages can be obtained according to the process of the invention including increased accuracy of the etch depths, increased production efficiency by eliminating off-line measurement steps of mask thickness before the wafer enters the plasma chamber, increased production efficiency by eliminating need to manually change etch recipes on an individual wafer basis. As the process of the invention allows etch endpoint to be automatically controlled in-situ, the invention offers significant advantages over timed etch processes based on statistically derived expected mask thicknesses and expected etch rates.

The following examples are provided for purposes of explaining how the invention can be implemented in a semiconductor manufacturing process. However, the invention can be embodied in other processes which can benefit from the advantages thereof.

EXAMPLE 1

The method of the invention can be implemented in a recess etch process as follows. In such a process, openings are etched into a substrate having a masking layer thereon, the masking layer having openings in a desired pattern corresponding to the openings to be formed in the substrate. According to the invention, the thickness of the masking layer is measured prior to etching the openings and that thickness is used to control the duration of the etching step. The determination of the masking layer thickness by interferometry is simplified in the case where the masking layer is of a single layer of material since calculation of the thickness will depend on the refractive index of the single layer of material. In the case where the masking layer consists of two or more layers, while calculation of the masking layer thickness is complicated by the different refractive indices of the various layers, it is still possible to use interferometry to calculate the thickness of the masking layer.

In the following discussion, recess etching of polysilicon through a silicon dioxide masking layer was carried out using a high density plasma etcher wherein RF energy is inductively coupled into the plasma reactor. The etching process included a breakthrough step wherein native oxide on the wafer is removed, a bulk etch step wherein material above the masking layer is cleared, and a recess etch step wherein openings in the masking layer are etched to a target depth.

A spectral plot similar to the plot shown in FIG. 1 can be used to generate data for use in the masking layer thickness measurement in accordance with the invention. In particular, the 400 to 500 nm spectral plot shown in FIG. 1 can be used to develop a software program which calculates the thickness of a masking layer prior to etching the openings in the masking layer. However, similar information can be obtained over different spectral ranges such as in the range of 10 to 1000 nm. The software program can be used to match up a stored curve profile with a measured curve profile and thus derive the thickness of a masking layer at a point in time before the masking layer is eroded by the etching plasma. Although the preferred method is to measure the masking layer thickness prior to etching of the openings in the masking layer, with suitably developed software, the masking layer thickness measurement can also be obtained during etching of the openings by performing the curve matching process at one or more times as the masking layer is eroded by the etching plasma. That is, a software program could be used to monitor the actual masking layer thickness during erosion thereof and use the recorded thickness measurements to more accurately determine the measured etch depths relative to the lower surface of the masking layer.

According to a preferred embodiment of the invention, the thickness of the masking layer is measured by interferometry at the moment when the polysilicon is etched through to the masking layer. For example, a chemical species (e.g., silicon chloride) in the plasma can be monitored and the thickness of the masking layer can be measured at the moment when the monitored chemical species in the plasma indicates when a layer overlying the masking layer has been etched through to the masking layer. During the recess etch portion of the etching process, the depth of the openings can be measured by interferometry. In order to determine when to terminate the etching process so that the openings will be at a precise etch depth with respect to the underside of the masking layer, a computer can be used to calculate when the target etch depth has been reached by taking into account (1) the measured depth of the openings relative to the simultaneously etched surface of the masking layer, (2) the etch rate of the masking layer and (3) the previously measured thickness of the masking layer. In essence, a highly accurate determination of the etch depth relative to the underside of the masking layer can be obtained by data processing which compensates for inaccuracies related to referencing the measured etch depths to the top surface of the masking layer during the interferometer measurement of the depth of the openings.

EXAMPLE 2

In the following discussion, recess etching of a stack structure of polysilicon over a silicon nitride masking layer over a p-doped silicon substrate was carried out using a high density plasma etcher wherein RF energy is inductively coupled into the plasma reactor. The recess etching process was carried out in a series of etchback and polysilicon filling steps. In the first etching step, the stack structure included a 300 nm polysilicon layer over a 200 nm nitride masking layer over a p-doped silicon substrate, each recess had an ONO (ozone CVD) collar, and the first etching step was carried out to achieve a target recess etch of over 1000 nm. Polysilicon was deposited in the etched openings and the masking layer was covered with polysilicon whereupon the stack structure included a 400 nm polysilicon layer over the nitride masking layer (which was etched in the first step to 150 nm) over the p-doped silicon substrate. In the second etching step, the openings were etched to a target depth of 120±30 nm. After depositing polysilicon so as to fill the etched openings and cover the masking layer, the structure was planarized by CMP whereupon the stack structure included the nitride masking layer (which was polished to about 120 nm) over the p-doped silicon substrate. In the third etching step, the openings were etched to a target depth of 50±15 nm.

Figure 2:
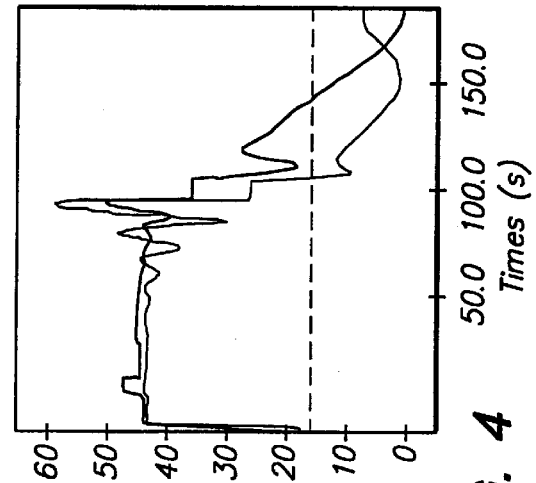
FIG. 2 shows a spectral response for 450 nm measured on a wafer having a silicon nitride masking layer which has been exposed by chemical mechanical polishing, the curve indicating breakthrough and recess etching steps in accordance with the invention.

The 400 nm to 500 nm spectral response before the third etching step is shown in FIG. 1 wherein the curve indicates the presence of a transparent film, i.e., the silicon nitride masking layer since the polysilicon has been cleared from the masking layer by the CMP process. A plot of the spectral response at 450 nm versus time is shown in FIG. 2 wherein the curve illustrates a spike at about 20 seconds where the native oxide is removed, a flat portion where the RF energy is turned off while the etching gas recipe is changed for the recess etch and the plasma is stabilized, a sinusoidal portion generated by the interferometric pattern of combined signals reflected from the top of the masking layer and bottom of the etched openings, and a spike at about 70 seconds indicating the etch endpoint.

Figure 3:
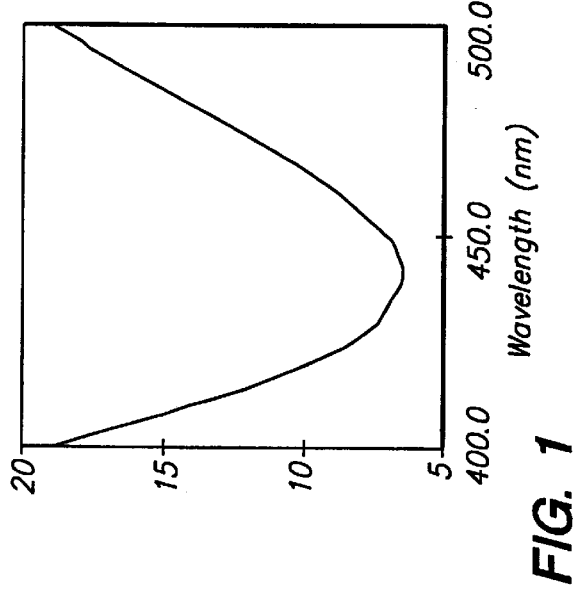
FIG. 3 shows a spectral response for 450 nm measured on a wafer having a layer of polysilicon overlying a silicon nitride masking layer, the curve indicating breakthrough, bulk and recess etching steps in accordance with the invention.

In the first and second etch steps described above, breakthrough, bulk etch and recess etch steps were carried out. In the breakthrough step the native oxide was removed, in the bulk etch step the polysilicon was cleared from the masking layer, and in the recess etch step the openings were etched to a depth of over 1000 nm in the first etch step and over 100 nm in the second etch step. A plot of spectral intensity at 450 nm versus time for the bulk etch and recess etch portions of the first and second etch steps will be similar to that shown in FIG. 3 wherein the initial sharp rise in the curve indicates when the plasma is turned on, the hump at around 10 seconds indicates the breakthrough step followed by a plasma stabilization step, and the appearance of a sinusoidal signal at around 70 seconds indicates when the polysilicon layer is etched away during the bulk etch to make the remaining polysilicon film transparent to the monitored frequency (i.e., 450 nm). As shown in FIG. 3, there is an increase in intensity of the sinusoidal signal as the polysilicon film becomes thinner and the flat portion of the curve at around 90 to 100 seconds indicates a period when the RF energy is turned off while a new etching gas chemistry for the recess etch is stabilized. Prior to the flat portion of the curve, an endpoint signal characteristic of the completion of the bulk polysilicon etch is generated, at which point the etching gas chemistry is changed to the recess etch gas chemistry and the masking layer thickness measurement is performed.

Figure 4:
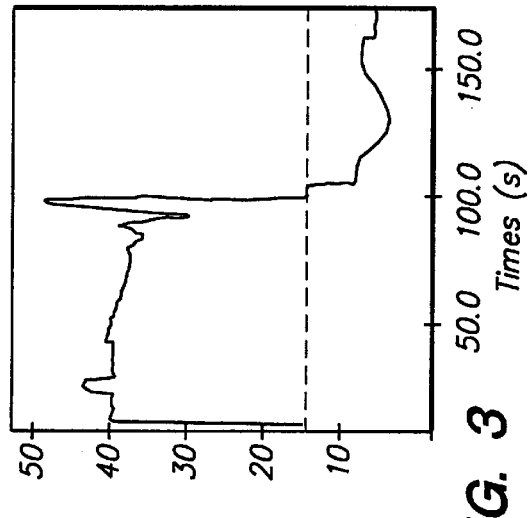
FIG. 4 shows a multi-frequency spectral response for 450 nm and 500 nm measured on a wafer having a layer of polysilicon overlying a silicon nitride masking layer, the curve indicating breakthrough, bulk and recess etching steps in accordance with the invention.

FIG. 4 shows spectral response curves for 450 nm and 500 nm. As shown, the spectral response at 450 nm and 500 nm differ in that the longer wavelength 500 nm line detects transparency of the eroded polysilicon film earlier than the 450 nm line. Such multi-frequency data can be used with other data obtained in accordance with the invention to determine a suitable endpoint to the recess etch step.

In the third etch step described above, only breakthrough and recess etch steps were carried out. In the breakthrough step, the native oxide was removed and during the recess etch the openings in the masking layer were etched to a depth of over 30 nm. The spectral plot for 450 nm is shown in FIG. 2 wherein the initial rise in the curve indicates energizing of the plasma, the first flat portion indicates stabilization of the plasma, the spike at about 20 seconds indicates breakthrough of the native oxide, the flat portion between 20 and 40 seconds indicates a change in the etch gas chemistry for the recess etch and stabilization of the plasma, the sinusoidal portion at around 35 seconds indicates the etching of the openings and the spike at around 75 seconds indicates the etching endpoint. Whereas in the first and second etching steps the masking layer thickness measurement can be performed during stabilization of the recess etching gas, the masking layer thickness measurement in the third etching step can be made when the wafer is first introduced into the plasma chamber.

Although the invention has been described with reference to a wafer as the semiconductor substrate, the process of the invention is applicable to other semiconductor substrates wherein accuracy in etch depths is desired. For example, such substrates could include disk drive components, flat panel display substrates, etc.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An apparatus for etching openings in a semiconductor substrate in a plasma chamber, comprising:
    a plasma etching chamber including a gas supply for supplying an etching gas into an interior of the chamber;
    a substrate support for supporting a semiconductor substrate in the interior of the plasma chamber, the semiconductor substrate including a masking layer and openings in the masking layer containing a material to be etched;
    an energy source which energizes the etching gas into a plasma which etches the material in the openings of the masking layer during an etching step;
    a thickness measuring device which measures a thickness of the masking layer and outputs a signal representative of the measured masking layer thickness prior to etching of the material in the openings in the masking layer; and
    a controller which receives the signal outputted from the thickness measuring device and automatically adjusts the etching step to achieve a target etch depth relative to an underside of the masking layer, the controller terminating the etching step when the target etch depth of the openings is obtained.

2. The apparatus as set forth in claim 1, wherein the thickness measuring device is an interferometer and the energy source generates a high density plasma.

3. The apparatus as set forth in claim 1, further comprising a detector which detects exposure of an upper surface of the masking layer during etching of a layer of material overlying the masking layer, the detector outputting a thickness measuring signal to the controller when a chemical species in the plasma is detected.

4. The apparatus as set forth in claim 3, wherein the masking layer is of silicon nitride and the chemical species detected by the detector is silicon chloride or the masking layer is a photoresist and the chemical species detected by the detector is CO.

5. The apparatus as set forth in claim 1, wherein the thickness measuring device measures the thickness of the masking layer during an etching process which includes clearing a layer of material overlying the masking layer.

6. The apparatus as set forth in claim 1, wherein the thickness measuring device measures the thickness of a masking layer which has been chemically-mechanically polished.

7. The apparatus as set forth in claim 1, wherein the controller terminates the etching step during etching of material in the openings wherein a stop layer is not present at the target etch depth.

8. The apparatus as set forth in claim 1, wherein the masking layer consists essentially of silicon nitride and the material in the openings consists essentially of polysilicon.

9. The apparatus as set forth in claim 1, wherein the masking layer comprises two or more layers of material or a photoresist.

10. The apparatus as set forth in claim 1, wherein the thickness measuring device is an interferometer which determines the thickness of the masking layer by measuring light reflected from upper and lower surfaces of the masking layer.

11. The apparatus as set forth in claim 10, wherein the thickness measuring device determines the thickness of the masking layer by comparing the actual signal generated by the reflected light to a stored signal derived for a given thickness of the masking layer.

12. The apparatus as set forth in claim 10, wherein light is reflected from the surface of the substrate during etching and wherein the signal created by light reflected from upper and lower surfaces of the masking layer is subtracted from the total signal created by the reflected light to determine the etch depth.

13. The apparatus as set forth in claim 1, wherein the thickness measuring device determines the thickness of the masking layer by comparing a stored curve profile with a measured curve profile.

* * * * *